US012803546B2

(12) United States Patent
Chen et al.

(10) Patent No.: US 12,803,546 B2
(45) Date of Patent: Nov. 17, 2026

(54) DATA RECEIVING APPARATUS AND METHOD HAVING DATA VALID WINDOW EXPANDING MECHANISM

(71) Applicant: REALTEK SEMICONDUCTOR CORPORATION, Hsinchu (TW)

(72) Inventors: Shih-Chang Chen, Hsinchu (TW); Chih-Wei Chang, Hsinchu (TW); Chun-Chi Yu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 19/082,748

(22) Filed: Mar. 18, 2025

(65) Prior Publication Data

US 2025/0300648 A1 Sep. 25, 2025

(30) Foreign Application Priority Data

Mar. 25, 2024 (TW) .................................. 113111099

(51) Int. Cl.

*H03K 5/1534* (2006.01)
*G11C 11/4076* (2006.01)
*H03K 5/13* (2014.01)
*H03K 19/20* (2006.01)
*H03K 5/00* (2006.01)

(52) U.S. Cl.

CPC ........ *H03K 5/1534* (2013.01); *G11C 11/4076* (2013.01); *H03K 5/13* (2013.01); *H03K 19/20* (2013.01); *H03K 2005/00058* (2013.01)

(58) Field of Classification Search

CPC ........ H03K 5/1534; H03K 5/13; H03K 19/20; H03K 2005/00058; H03K 5/153; H03K 5/133; H03K 5/134; H03K 5/135; H03K 5/14; H03K 19/00; H03K 2005/00013; H03K 2005/00078; G11C 11/4076

See application file for complete search history.

(56) References Cited

U.S. PATENT DOCUMENTS

2003/0042954 A1 * 3/2003 Chuang .................. H03K 5/135 327/172

* cited by examiner

*Primary Examiner* — Jung Kim
(74) *Attorney, Agent, or Firm* — WPAT, PC

(57) ABSTRACT

A data receiving apparatus having data valid window expanding mechanism is provided. An AND gate and an OR gate respectively perform logic operation on an input data signal and a delayed data signal delayed therefrom. A rising edge data multiplexer selects the OR gate processed signal and the AND gate processed signal respectively when a previous falling edge sampling result is at a low state and a high state to be outputted as a current rising edge data. A falling edge data multiplexer selects the OR gate processed signal and the AND gate processed signal respectively when a previous rising edge sampling result is at a low state and a high state to be outputted as a current falling edge data. A sampling circuit respectively performs rising and falling edge sampling on the current rising and the falling edge data to generate sampling results.

10 Claims, 5 Drawing Sheets

100

500

DATA RECEIVING APPARATUS AND METHOD HAVING DATA VALID WINDOW EXPANDING MECHANISM

BACKGROUND OF THE INVENTION

1. Field of the Invention

The present disclosure relates to a data receiving apparatus and a data receiving method having data valid window expanding mechanism.

2. Description of Related Art

A double data rate (DDR) memory performs data transmission by using both a rising edge and a falling edge of the system clock signal to accomplish a transmission speed that is twice of the system clock signal. In a conventional design, a plurality of clock signals are used in the data receiving apparatus of the DDR memory to perform over-sampling to dynamically adjust the sampling timing according to the relation among a plurality of sampling results.

However, along with the development of the faster memory speed, the channel dispersion condition becomes severe. The amount of the signal transition in some data sequences becomes insufficient. When only the over-sampling mechanism is used to perform data sampling, the inaccurate sampling result may still occur such that the sampling timing can not be adjusted accurately either such that the final sampling result is inaccurate.

SUMMARY OF THE INVENTION

In consideration of the problem of the prior art, an object of the present disclosure is to provide a data receiving apparatus and a data receiving method having data valid window expanding mechanism.

The present invention discloses a data receiving apparatus having a data valid window expanding mechanism that includes a data delay circuit, an AND gate, an OR gate, a rising edge data multiplexer, a falling edge data multiplexer and a sampling circuit. The data delay circuit is configured to receive and delay an input data signal to generate a delayed data signal. The AND gate is configured to perform an AND logic operation on the input data signal and the delayed data signal to generate an AND gate processed signal. The OR gate is configured to perform an OR logic operation on the input data signal and the delayed data signal to generate an OR gate processed signal. The rising edge data multiplexer is configured to select the OR gate processed signal to be outputted as current rising edge data when a previous falling edge sampling result is at a low state, and select the AND gate processed signal to be outputted as the current rising edge data when the previous falling edge sampling result is at a high state. The falling edge data multiplexer is configured to select the OR gate processed signal to be outputted as current falling edge data when a previous rising edge sampling result is at the low state, and select the AND gate processed signal to be outputted as the current falling edge data when the previous rising edge sampling result is at the high state. The sampling circuit is configured to sample the current rising edge data according to a sampling rising edge of a data strobe signal to generate a current rising edge sampling result and sample the current falling edge data according to a sampling falling edge of the data strobe signal to generate a current falling edge sampling result, wherein the previous rising edge sampling result is neighboring and previous to the current falling edge sampling result and the previous falling edge sampling result is neighboring and previous to the current rising edge sampling result.

The present invention also discloses a data receiving method having a data valid window expanding mechanism that includes steps outlined below. An input data signal is received and delayed to generate a delayed data signal by a data delay circuit. An AND logic operation is performed on the input data signal and the delayed data signal to generate an AND gate processed signal by an AND gate. An OR logic operation is performed on the input data signal and the delayed data signal to generate an OR gate processed signal by an OR gate. The OR gate processed signal is selected to be outputted as current rising edge data by a rising edge data multiplexer when a previous falling edge sampling result is at a low state, and the AND gate processed signal is selected to be outputted as the current rising edge data by the rising edge data multiplexer when the previous falling edge sampling result is at a high state. The OR gate processed signal is selected to be outputted as current falling edge data by a falling edge data multiplexer when a previous rising edge sampling result is at the low state, and the AND gate processed signal is selected to be outputted as the current falling edge data by the falling edge data multiplexer when the previous rising edge sampling result is at the high state. The current rising edge data is sampled according to a sampling rising edge of a data strobe signal by a sampling circuit to generate a current rising edge sampling result and the current falling edge data is sampled according to a sampling falling edge of the data strobe signal by the sampling circuit to generate a current falling edge sampling result, wherein the previous rising edge sampling result is neighboring and previous to the current falling edge sampling result and the previous falling edge sampling result is neighboring and previous to the current rising edge sampling result.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a data receiving apparatus and a data receiving method having the data valid window expanding mechanism to perform an AND logic operation and an OR logic operation on an input data signal and a delayed data signal to generate an AND gate processed signal and an OR gate processed signal, and select one of the AND gate processed signal and the OR gate processed signal according to a previous sampling result to be outputted as current data to be sampled. The data valid window expanding mechanism is thus accomplished to increase the data sampling accuracy.

Figure 1:
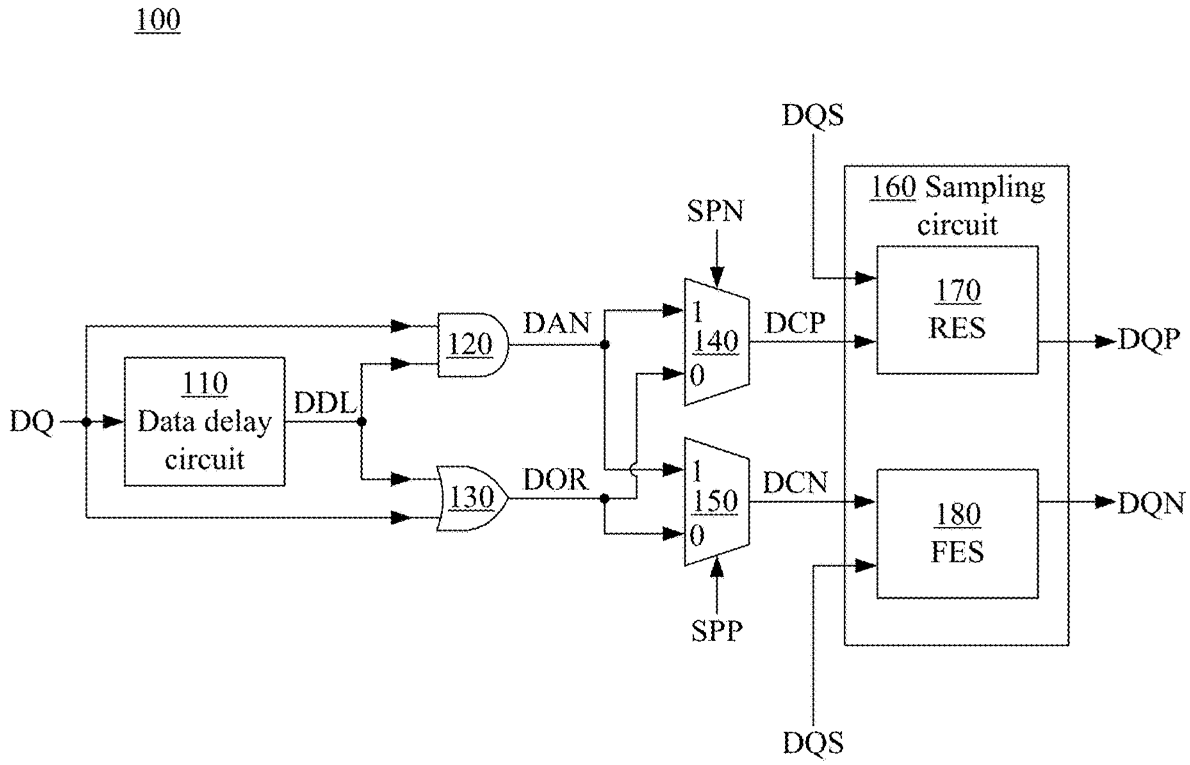
FIG. 1 illustrates a block diagram of a data receiving apparatus having a data valid window expanding mechanism according to an embodiment of the present invention.
Figure 2:
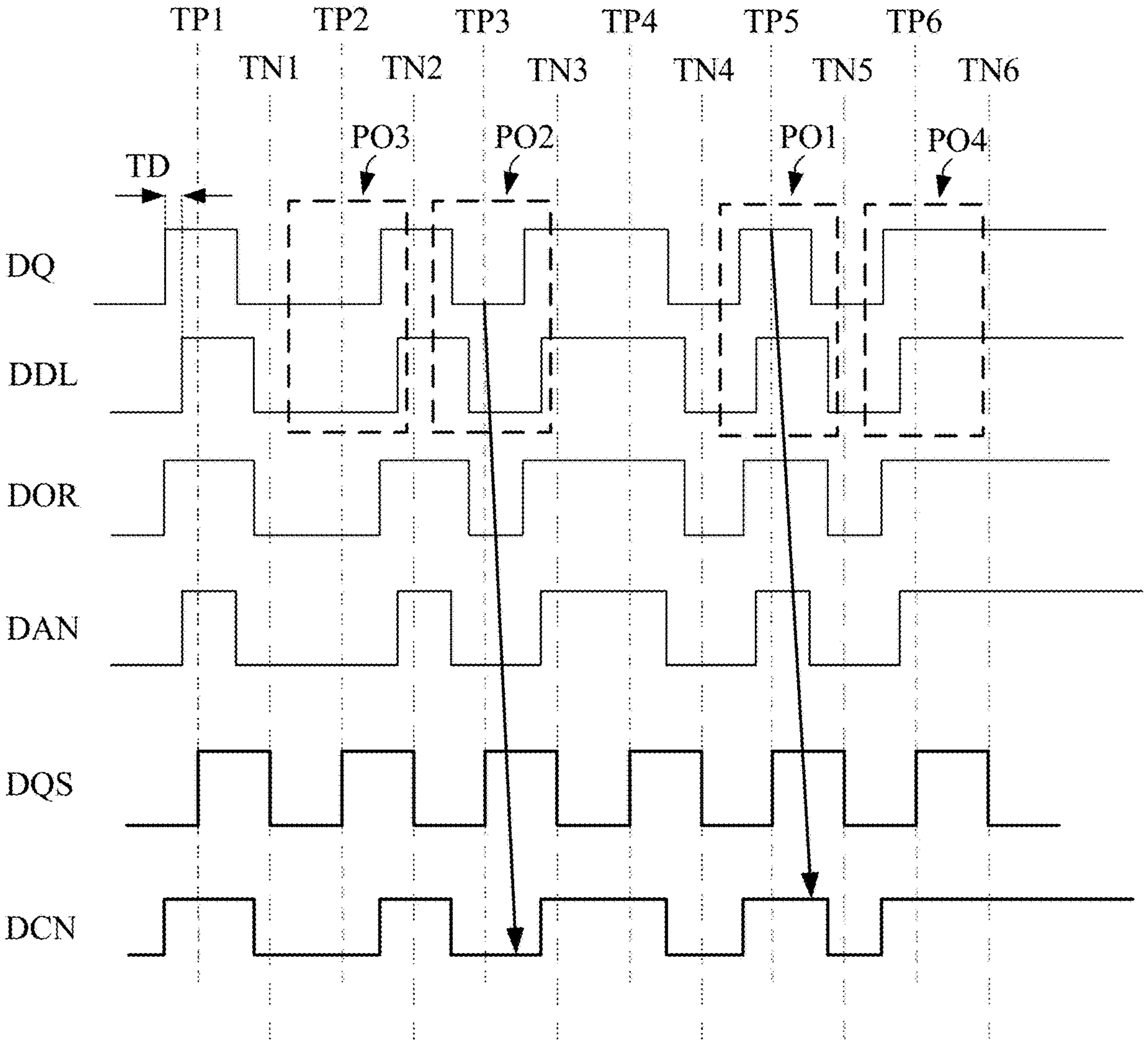
FIG. 2 illustrates a waveform diagram of a plurality of signals related to the operation of the data receiving apparatus according to an embodiment of the present invention.

Reference is now made to FIG. 1 and FIG. 2 at the same time. FIG. 1 illustrates a block diagram of a data receiving apparatus 100 having a data valid window expanding mechanism according to an embodiment of the present invention. FIG. 2 illustrates a waveform diagram of a plurality of signals related to the operation of the data receiving apparatus 100 according to an embodiment of the present invention. In FIG. 2, the X-axis stands for time and the Y-axis stands for signal intensity.

The data receiving apparatus 100 is disposed in such as, but not limited to a double data rate (DDR) memory and includes a data delay circuit 110, a AND gate 120, a OR gate 130, a rising edge data multiplexer 140, a falling edge data multiplexer 150 and a sampling circuit 160.

The data delay circuit 110 is configured to receive and delay an input data signal DQ to generate a delayed data signal DDL.

As illustrated in FIG. 2, in an embodiment, the data delay circuit 110 delays the input data signal DQ by a data delay time amount TD such that the timing of the delayed data signal DDL is behind the timing of the input data signal DQ by a time length equaling to the data delay time amount TD.

The AND gate 120 is configured to perform an AND logic operation on the input data signal DQ and the delayed data signal DDL to generate an AND gate processed signal DAN.

As illustrated in FIG. 2, as long as one of the input data signal DQ and the delayed data signal DDL is at a low state, the AND gate processed signal DAN is at the low state. On the contrary, only when both of the input data signal DQ and the delayed data signal DDL are at a high state, the AND gate processed signal DAN is at the high state.

The OR gate 130 is configured to perform an OR logic operation on the input data signal DQ and the delayed data signal DDL to generate an OR gate processed signal DOR.

As illustrated in FIG. 2, as long as one of the input data signal DQ and the delayed data signal DDL is at the high state, the OR gate processed signal DOR is at the high state. On the contrary, only when both of the input data signal DQ and the delayed data signal DDL are at the low state, the OR gate processed signal DOR is at the low state.

It is appreciated that in practical implementation, the processing of the circuits takes time such that the timings of the AND gate processed signal DAN and the OR gate processed signal DOR are actually slightly behind the timing of the input data signal DQ. However, in order to observe the relation among different signals, the timings of the AND gate processed signal DAN and the OR gate processed signal DOR are illustrated to be aligned with the timing of the input data signal DQ in FIG. 2.

The rising edge data multiplexer 140 is configured to select the OR gate processed signal DOR to be outputted as current rising edge data DCP when a previous falling edge sampling result SPN is at the low state, and select the AND gate processed signal DAN to be outputted as current rising edge data DCP when the previous falling edge sampling result SPN is at the high state.

The falling edge data multiplexer 150 is configured to select the OR gate processed signal DOR to be outputted as current falling edge data DCN when a previous rising edge sampling result SPP is at the low state, and select the AND gate processed signal DAN to be outputted as the current falling edge data DCN when the previous rising edge sampling result SPP is at the high state.

In an embodiment, the sampling circuit 160 includes a rising edge sampling circuit 170 and a falling edge sampling circuit 180.

The rising edge sampling circuit 170 is configured to sample the current rising edge data DCP according to a sampling rising edge of a data strobe signal DQS to generate a current rising edge sampling result DQP. The previous falling edge sampling result SPN is neighboring and previous to the current rising edge sampling result DQP.

As illustrated in FIG. 2, time spots TP1~TP6 all correspond to the sampling rising edges of the data strobe signal DQS. The rising edge sampling circuit 170 samples the current rising edge data DCP at these time spots according to the sampling rising edges of the data strobe signal DQS to generate the current rising edge sampling result DQP.

The falling edge sampling circuit 180 samples the current falling edge data DCN according to a sampling falling edge of the data strobe signal DQS to generate a current falling edge sampling result DQN. The previous rising edge sampling result SPP is neighboring and previous to the current falling edge sampling result DQN.

As illustrated in FIG. 2, time spots TN1~TN6 all correspond to the sampling falling edges of the data strobe signal DQS. The falling edge sampling circuit 180 samples the current falling edge data DCN at these time spots according to the sampling falling edges of the data strobe signal DQS to generate the current falling edge sampling result DQN.

Figure 3A:
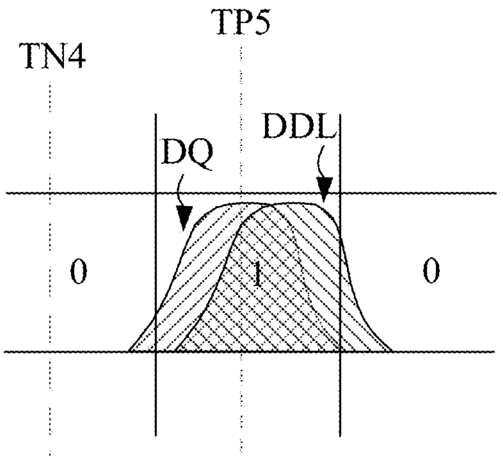
FIG. 3A illustrates a first data sequence of the input data signal and the delayed data signal corresponding to a first position in FIG. 2 according to an embodiment of the present invention.
Figure 3B:
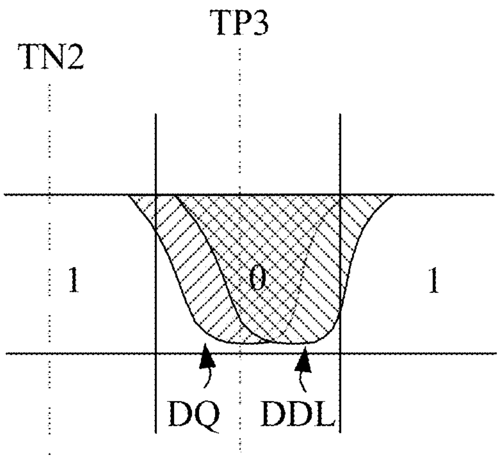
FIG. 3B illustrates a second data sequence of the input data signal and the delayed data signal corresponding to a second position in FIG. 2 according to an embodiment of the present invention.

The generation of the current rising edge data DCP is used as an example to describe the data valid window expanding mechanism in detail in accompany with FIG. 2, FIG. 3A and FIG. 3B.

Reference is now made to FIG. 2 and FIG. 3A at the same time. FIG. 3A illustrates a first data sequence of the input data signal DQ and the delayed data signal DDL corresponding to a first position PO1 in FIG. 2 according to an embodiment of the present invention.

In the present embodiment, the first data sequence is (0, 1, 0). In FIG. 3A, the high state of the input data signal DQ is illustrated by an area of slash lines labeled by a value 1. The low state of the input data signal DQ is illustrated by a blanked area labeled by a value 0. On the other hand, the high state of the delayed data signal DDL is illustrated by an area of backslash lines labeled by a value 1. The low state of the delayed data signal DDL is illustrated by a blanked area labeled by a value 0.

Corresponding to the first position PO1 in FIG. 2, the rising edge sampling circuit 170 performs sampling at the time spot TP5 according to the sampling rising edge of the data strobe signal DQS. Under such a condition, the sampling rising edge at the time spot TP5 corresponds to the high state of the input data signal DQ and the delayed data signal DDL, which is the “1” in the first data sequence of (0, 1, 0).

Since the previous falling edge sampling result SPN is neighboring and previous to the current rising edge sampling result DQP, for the current rising edge sampling result DQP to be generated at the time spot TP5, the previous falling edge sampling result SPN is the sampling result generated by the falling edge sampling circuit 180 according to the sampling falling edge of the data strobe signal DQS at the time spot TN4. The previous falling edge sampling result SPN is the low state, which is the "0" before the "1" in the first data sequence of (0, 1, 0).

The rising edge data multiplexer 140 selects the OR gate processed signal DOR to be outputted as the current rising edge data DCP according to the previous falling edge sampling result SPN at the low state. The current rising edge data DCP becomes the union of the high states of the input data signal DQ and the delayed data signal DDL, including all the areas of the slash lines and the backslash lines in FIG. 3A.

By selecting the OR gate processed signal DOR to generate the current rising edge data DCP, the range of the high state of the input data signal DQ expands according to the OR logic operation performed with the delayed data signal DDL. The chance that the rising edge sampling circuit 170 samples the accurate data content according to the sampling rising edge of the data strobe signal DQS increases accordingly. As a result, the OR gate processed signal DOR is configured to perform a data valid window expanding on the first data sequence of (0, 1, 0).

Reference is now made to FIG. 2 and FIG. 3B at the same time. FIG. 3B illustrates a second data sequence of the input data signal DQ and the delayed data signal DDL corresponding to a second position PO2 in FIG. 2 according to an embodiment of the present invention.

In the present embodiment, the second data sequence is (1, 0, 1). In FIG. 3B, the low state of the input data signal DQ is illustrated by an area of slash lines labeled by a value 0. The high state of the input data signal DQ is illustrated by a blanked area labeled by a value 1. On the other hand, the low state of the delayed data signal DDL is illustrated by an area of backslash lines labeled by a value 0. The high state of the delayed data signal DDL is illustrated by a blanked area labeled by a value 1.

Corresponding to the second position PO2 in FIG. 2, the rising edge sampling circuit 170 performs sampling at the time spot TP3 according to the sampling rising edge of the data strobe signal DQS. Under such a condition, the sampling rising edge at the time spot TP3 corresponds to the low state of the input data signal DQ and the delayed data signal DDL, which is the "0" in the second data sequence of (1, 0, 1).

Since the previous falling edge sampling result SPN is neighboring and previous to the current rising edge sampling result DQP, for the current rising edge sampling result DQP to be generated at the time spot TP3, the previous falling edge sampling result SPN is the sampling result generated by the falling edge sampling circuit 180 according to the sampling falling edge of the data strobe signal DQS at the time spot TN2. The previous falling edge sampling result SPN is the high state, which is the "1" before the "0" in the second data sequence of (1, 0, 1).

The rising edge data multiplexer 140 selects the AND gate processed signal DAN to be outputted as the current rising edge data DCP according to the previous falling edge sampling result SPN at the high state. The current rising edge data DCP becomes the intersection of the low states of the input data signal DQ and the delayed data signal DDL, including all the areas of the slash lines and the backslash lines in FIG. 3B.

By selecting the AND gate processed signal DAN to generate the current rising edge data DCP, the range of the low state of the input data signal DQ expands according to the AND logic operation performed with the delayed data signal DDL. The chance that the rising edge sampling circuit 170 samples the accurate data content according to the sampling rising edge of the data strobe signal DQS increases accordingly. As a result, the AND gate processed signal DAN is configured to perform a data valid window expanding on the second data sequence of (1, 0, 1).

Based on the above description, the rising edge data multiplexer 140 selects one of the AND gate processed signal DAN and the OR gate processed signal DOR to be outputted according to the state of the previous falling edge sampling result SPN, such that the data valid window of the data sequences (0, 1, 0) and (1, 0, 1) can be expanded to increase the possibility of obtaining an accurate sampling result according to the sampling rising edge of the data strobe signal DQS.

It is appreciated that in FIG. 2 only the current rising edge data DCP is illustrated as an example, in which the current falling edge data DCN is not illustrated. However, the data valid window expanding mechanism applied to the current rising edge data DCP can be applied to the current falling edge data DCN as well. The detail is not described herein.

Ideally, the data delay time amount TD applied to the input data signal DQ by the data delay circuit 110 is preferably larger under the condition that the input data signal DQ and the delayed data signal DDL are overlapped.

For the data sequence (0, 0, 1) that a third position PO3 in FIG. 2 corresponds to, corresponding to the low state that the sampling rising edge at the time spot TP2 supposes to sample, the rising edge data multiplexer 140 selects the OR gate processed signal DOR to be outputted as the current rising edge data DCP according to the previous falling edge sampling result SPN at the low state. The low state to be sampled by the sampling rising edge of the data strobe signal DQS is thus limited by the degree of the intersymbol interference (ISI) of the input data signal DQ, such that the expansion of the data valid window reaches the limit. Similarly, the data sequence (1, 1, 0) that a fourth position PO4 in FIG. 2 has the same limitation due to the same rationale. Such a limitation prevents the data delay time amount TD from increasing.

However, when the intersymbol interference is not presented, the boundary of the data sequences (0, 0, 1) and (1, 1, 0) is the same as the data sequence (0, 1, 0) and (1, 0, 1) described above. Even if the expansion performed based on the AND logic operation or the OR logic operation applied to the data sequences (0, 1, 0) and (1, 0, 1) and the delayed data signal DDL is still limited by the boundary of the data sequences (0, 0, 1) and (1, 1, 0), the data valid window of the data sequences (0, 1, 0) and (1, 0, 1) is smaller than the data valid window of the data sequences (0, 0, 1) and (1, 1, 0) when the intersymbol interference is severe. By using the AND logic operation or the OR logic operation described above, the data valid window of the data sequences (0, 1, 0) and (1, 0, 1) can be pushed to the boundary of the data sequences (0, 0, 1) and (1, 1, 0).

In some approaches, the data receiving apparatus in the double data rate memory uses a plurality of clock signals to perform over-sampling to dynamically adjust the sampling timing according to the relation among a plurality of sampling results. However, along with the development of the faster memory speed, the channel dispersion condition becomes severe. The amount of the signal transition in the data sequences such as (0, 1, 0) and (1, 0, 1) becomes insufficient (e.g., the signal in the data sequence (0, 1, 0) does not fully turn from the low state to the high state and return to the low state again or the signal in the data sequence (1, 0, 1) does not fully turn from the high state to the low state and return to the high state again). When only the over-sampling mechanism is used to perform data sampling, the inaccurate sampling result may still occur such that the sampling timing can not be adjusted accurately either such that the final sampling result is inaccurate.

The data receiving apparatus having the data valid window expanding mechanism of the present invention performs an AND logic operation and an OR logic operation on an input data signal and a delayed data signal to generate an AND gate processed signal and an OR gate processed signal, and select one of the AND gate processed signal and the OR gate processed signal according to a previous sampling result to be outputted as current data to be sampled. The data valid window expanding mechanism is thus accomplished to increase the data sampling accuracy.

Figure 4:
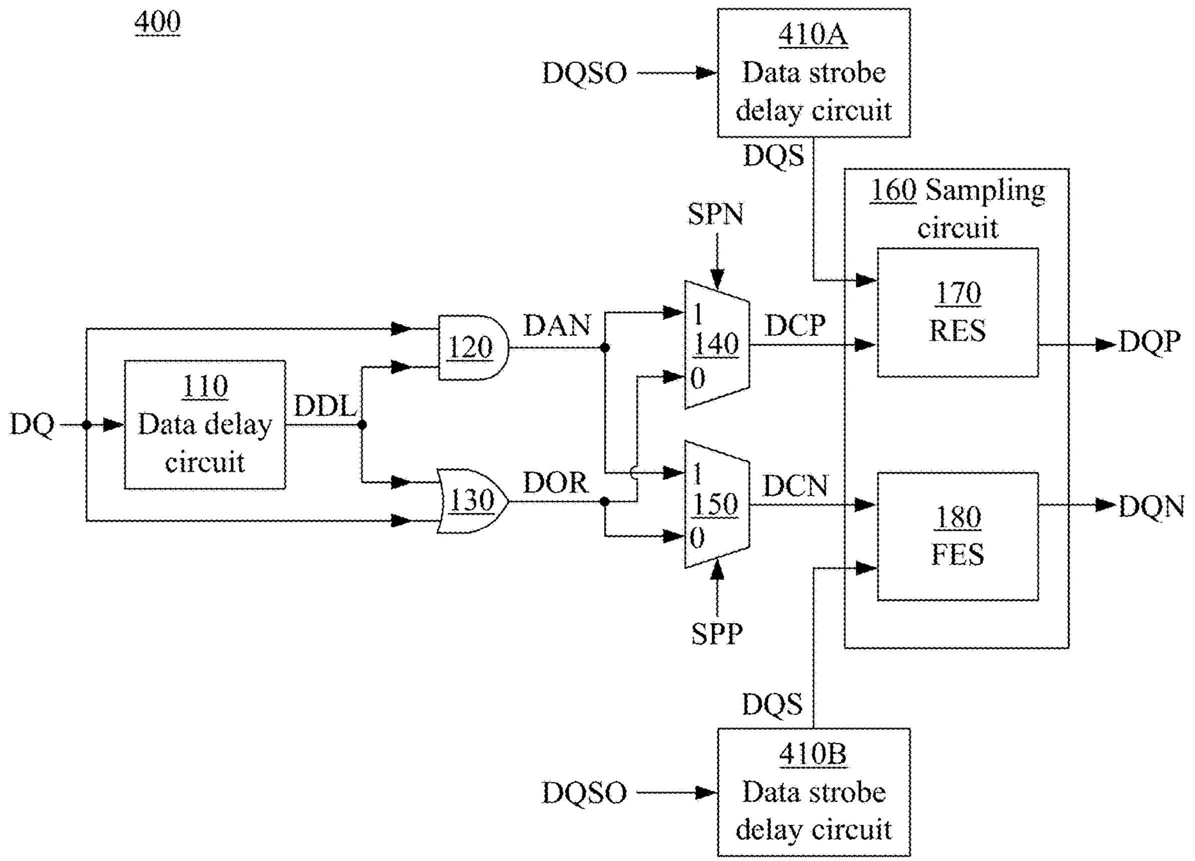
FIG. 4 illustrates a block diagram of a data receiving apparatus having a data valid window expanding mechanism according to another embodiment of the present invention.

Reference is now made to FIG. 4. FIG. 4 illustrates a block diagram of a data receiving apparatus 400 having a data valid window expanding mechanism according to another embodiment of the present invention. The data receiving apparatus 400 is similar to the data receiving apparatus 100 in FIG. 1 and includes the data delay circuit 110, the AND gate 120, the OR gate 130, the rising edge data multiplexer 140, the falling edge data multiplexer 150 and the sampling circuit 160. The function and the operation of the identical components are not further described in detail herein.

In the present embodiment, the data receiving apparatus 400 further includes a data strobe delay circuit 410A and a data strobe delay circuit 410B. The data strobe delay circuit 410A and the data strobe delay circuit 410B are respectively configured to receive and delay an original the data strobe signal DQSO of the input data signal DQ to generate the data strobe signal DQS.

In an embodiment, the data receiving apparatus 100 receives the input data signal DQ and the original the data strobe signal DQSO from an external apparatus (not illustrated). However, the input data signal DQ requires the processing of a plurality of circuits such that the current rising edge data DCP and the current falling edge data DCN are generated accordingly. As a result, the data strobe delay time amount of the data strobe delay circuit 410A and the data strobe delay circuit 410B is equivalent to a time length from a first time spot that the data delay circuit 110 receives the input data signal DQ to a second time spot that the rising edge data multiplexer 140 and the falling edge data multiplexer 150 generates the current rising edge data DCP and the current falling edge data DCN.

After being processed by the data strobe delay circuit 410A and the data strobe delay circuit 410B, the rising edge sampling circuit 170 (abbreviated as RES in FIG. 1) and the falling edge sampling circuit 180 (abbreviated as FES in FIG. 1) samples the current rising edge data DCP and the current falling edge data DCN according to the correct timing of the data strobe signal DQS.

In practical implementation, the data strobe delay circuit 410A and the data strobe delay circuit 410B may configure the same data strobe delay time amount or may configure different data strobe delay time amounts, depending on practical requirements. The present invention is not limited thereto.

Figure 5:
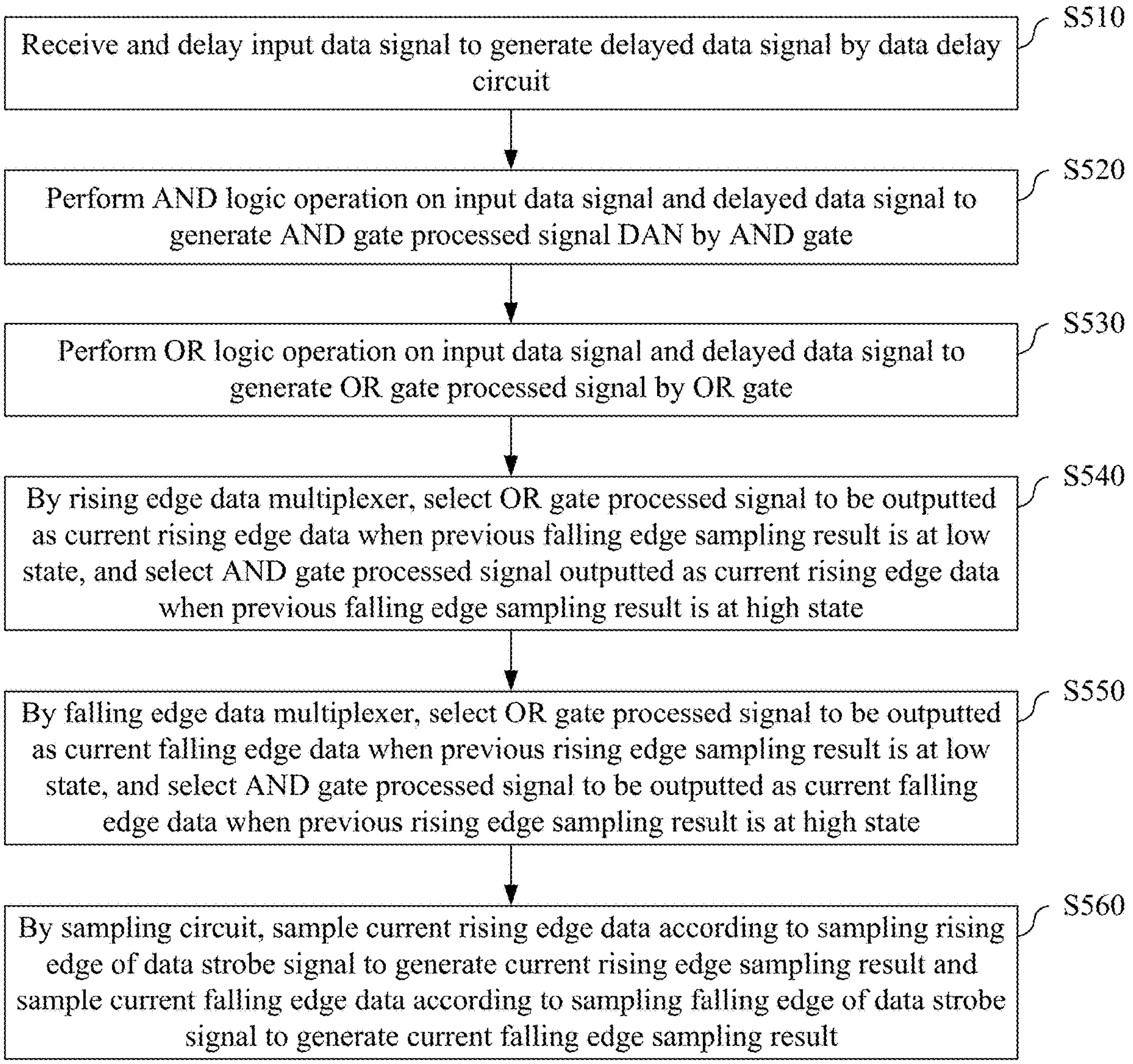
FIG. 5 illustrates a flow chart of a data receiving method having a data valid window expanding mechanism according to an embodiment of the present invention.

Reference is now made to FIG. 5. FIG. 5 illustrates a flow chart of a data receiving method 500 having a data valid window expanding mechanism according to an embodiment of the present invention.

Besides the apparatus described above, the present invention further discloses the data receiving method 500 that can be used in such as, but not limited to the data receiving apparatus 100 illustrated in FIG. 1. An embodiment of the data receiving method 500 is illustrated in FIG. 5 and includes the steps outlined below.

In step S510, the input data signal DQ is received and delayed to generate the delayed data signal DDL by the data delay circuit 110.

In step S520, the AND logic operation is performed on the input data signal DQ and the delayed data signal DLL to generate the AND gate processed signal DAN by the AND gate 120.

In step S530, the OR logic operation is performed on the input data signal DQ and the delayed data signal DLL to generate the OR gate processed signal DOR by the OR gate 130.

In step S540, the OR gate processed signal DOR is selected to be outputted as the current rising edge data DCP by the rising edge data multiplexer 140 when the previous falling edge sampling result SPN is at the low state, and the AND gate processed signal DAN is selected to be outputted as the current rising edge data DCP by the rising edge data multiplexer 140 when the previous falling edge sampling result SPN is at the high state.

In step S550, the OR gate processed signal DOR is selected to be outputted as the current falling edge data DCN by the falling edge data multiplexer 150 when the previous rising edge sampling result SPP is at the low state, and the AND gate processed signal DAN is selected to be outputted as the current falling edge data DCN by the falling edge data multiplexer 150 when the previous rising edge sampling result SPP is at the high state.

In step S560, the current rising edge data DCP is sampled according to the sampling rising edge of the data strobe signal DQS by the sampling circuit 160 to generate the current rising edge sampling result DQP and the current falling edge data DCN is sampled according to the sampling falling edge of the data strobe signal DQS by the sampling circuit 160 to generate the current falling edge sampling result DQN, wherein the previous rising edge sampling result SPP is neighboring and previous to the current falling edge sampling result DQN and the previous falling edge sampling result SPN is neighboring and previous to the current rising edge sampling result DQP.

It is appreciated that the embodiments described above are merely an example. In other embodiments, it is appreciated that many modifications and changes may be made by those of ordinary skill in the art without departing, from the spirit of the invention.

In summary, the data receiving apparatus and the data receiving method having the data valid window expanding mechanism of the present invention perform an AND logic operation and an OR logic operation on an input data signal and a delayed data signal to generate an AND gate processed signal and an OR gate processed signal, and select one of the AND gate processed signal and the OR gate processed signal according to a previous sampling result to be outputted as current data to be sampled. The data valid window expanding mechanism is thus accomplished to increase the data sampling accuracy.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A data receiving apparatus having a data valid window expanding mechanism, comprising:

a data delay circuit configured to receive and delay an input data signal to generate a delayed data signal;

an AND gate configured to perform an AND logic operation on the input data signal and the delayed data signal to generate an AND gate processed signal;

an OR gate configured to perform an OR logic operation on the input data signal and the delayed data signal to generate an OR gate processed signal;

a rising edge data multiplexer configured to select the OR gate processed signal to be outputted as current rising edge data when a previous falling edge sampling result is at a low state, and select the AND gate processed signal to be outputted as the current rising edge data when the previous falling edge sampling result is at a high state;

a falling edge data multiplexer configured to select the OR gate processed signal to be outputted as current falling edge data when a previous rising edge sampling result is at the low state, and select the AND gate processed signal to be outputted as the current falling edge data when the previous rising edge sampling result is at the high state; and a sampling circuit configured to sample the current rising edge data according to a sampling rising edge of a data strobe signal to generate a current rising edge sampling result and sample the current falling edge data according to a sampling falling edge of the data strobe signal to generate a current falling edge sampling result, wherein the previous rising edge sampling result is neighboring and previous to the current falling edge sampling result and the previous falling edge sampling result is neighboring and previous to the current rising edge sampling result.

2. The data receiving apparatus of claim 1, further comprising a data strobe delay circuit configured to receive and delay an original data strobe signal corresponding to the input data signal to generate the data strobe signal.

3. The data receiving apparatus of claim 2, wherein a data strobe delay time amount of the data strobe delay circuit is equivalent to a time length from a first time spot that the data delay circuit receives the input data signal to a second time spot that the rising edge data multiplexer and the falling edge data multiplexer generate the current rising edge data and the current falling edge data.

4. The data receiving apparatus of claim 1, wherein the sampling circuit comprises:

a rising edge sampling circuit configured to sample the current rising edge data according to the sampling rising edge to generate the current rising edge sampling result; and a falling edge sampling circuit configured to sample the current falling edge data according to the sampling falling edge to generate the current falling edge sampling result.

5. The data receiving apparatus of claim 1, wherein the OR gate processed signal is configured to perform a data valid window expanding on a first data sequence of (0, 1, 0) and the AND gate processed signal is configured to perform the data valid window expanding on a second data sequence of (1, 0, 1).

6. A data receiving method having a data valid window expanding mechanism, comprising:

receiving and delaying an input data signal to generate a delayed data signal by a data delay circuit;

performing an AND logic operation on the input data signal and the delayed data signal to generate an AND gate processed signal by an AND gate;

performing an OR logic operation on the input data signal and the delayed data signal to generate an OR gate processed signal by an OR gate;

selecting the OR gate processed signal to be outputted as current rising edge data by a rising edge data multiplexer when a previous falling edge sampling result is at a low state, and selecting the AND gate processed signal to be outputted as the current rising edge data by the rising edge data multiplexer when the previous falling edge sampling result is at a high state;

selecting the OR gate processed signal to be outputted as current falling edge data by a falling edge data multiplexer when a previous rising edge sampling result is at the low state, and select the AND gate processed signal to be outputted as the current falling edge data by the falling edge data multiplexer when the previous rising edge sampling result is at the high state; and sampling the current rising edge data according to a sampling rising edge of a data strobe signal by a sampling circuit to generate a current rising edge sampling result and sampling the current falling edge data according to a sampling falling edge of the data strobe signal by the sampling circuit to generate a current falling edge sampling result, wherein the previous rising edge sampling result is neighboring and previous to the current falling edge sampling result and the previous falling edge sampling result is neighboring and previous to the current rising edge sampling result.

7. The data receiving method of claim 6, further comprising:

receiving and delaying an original data strobe signal corresponding to the input data signal to generate the data strobe signal by a data strobe delay circuit.

8. The data receiving method of claim 7, wherein a data strobe delay time amount of the data strobe delay circuit is equivalent to a time length from a first time spot that the data delay circuit receives the input data signal to a second time spot that the rising edge data multiplexer and the falling edge data multiplexer generate the current rising edge data and the current falling edge data.

9. The data receiving method of claim 6, further comprising:

sampling the current rising edge data according to the sampling rising edge to generate the current rising edge sampling result by a rising edge sampling circuit comprised by the sampling circuit; and sampling the current falling edge data according to the sampling falling edge to generate the current falling edge sampling result by a falling edge sampling circuit comprised by the sampling circuit.

10. The data receiving method of claim 6, wherein the OR gate processed signal is configured to perform a data valid window expanding on a first data sequence of (0, 1, 0) and the AND gate processed signal is configured to perform the data valid window expanding on a second data sequence of (1, 0, 1).

* * * * *